United States Patent
Han et al.

(10) Patent No.: US 7,335,960 B2
(45) Date of Patent: Feb. 26, 2008

(54) MRAM CELL WITH FLAT TOPOGRAPHY AND CONTROLLED BIT LINE TO FREE LAYER DISTANCE AND METHOD OF MANUFACTURE

(75) Inventors: Cherng-Chyi Han, San Jose, CA (US); Liubo Hong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 141 days.

(21) Appl. No.: 11/179,252

(22) Filed: Jul. 12, 2005

(65) Prior Publication Data
US 2005/0248980 A1 Nov. 10, 2005

Related U.S. Application Data

(62) Division of application No. 10/732,013, filed on Dec. 10, 2003, now Pat. No. 6,969,895.

(51) Int. Cl.
*H01L 43/00* (2006.01)
(52) U.S. Cl. .............. 257/421; 257/E27.006; 257/295; 438/48; 365/158
(58) Field of Classification Search .......... 257/421
See application file for complete search history.

(56) References Cited

U.S. PATENT DOCUMENTS

| 6,174,737 | B1 | 1/2001 | Durlam et al. ............. 438/3 |
| 6,548,849 | B1 | 4/2003 | Pan et al. ................. 257/296 |
| 6,744,608 | B1 | 6/2004 | Sin et al. ................. 360/324.2 |
| 2002/0196647 | A1* | 12/2002 | Nickel ........................ 365/46 |
| 2004/0109339 | A1* | 6/2004 | Tsang ......................... 365/98 |
| 2006/0138576 | A1* | 6/2006 | Galdis ....................... 257/421 |

\* cited by examiner

*Primary Examiner*—Tu-Tu Ho
(74) *Attorney, Agent, or Firm*—Saile Ackerman LLC; Stephen B. Ackerman

(57) ABSTRACT

A method for forming MRAM cell structures wherein the topography of the cell is substantially flat and the distance between a bit line and a magnetic free layer, a word line and a magnetic free layer or a word line and a bit line and a magnetic free layer is precise and well controlled. The method includes the formation of an MTJ film stack over which is formed both a capping and sacrificial layer. The stack is patterned by conventional means, then is covered by a layer of insulation which is thinned by CMP to expose a remaining portion of the sacrificial layer. The remaining portion of the sacrificial layer can be precisely removed by an etching process, leaving only the well dimensioned capping layer to separate the bit line from the magnetic free layer and the capping layer. The bit line and an intervening layer of insulation separate the free layer from a word line in an equally precise and controlled manner.

9 Claims, 5 Drawing Sheets

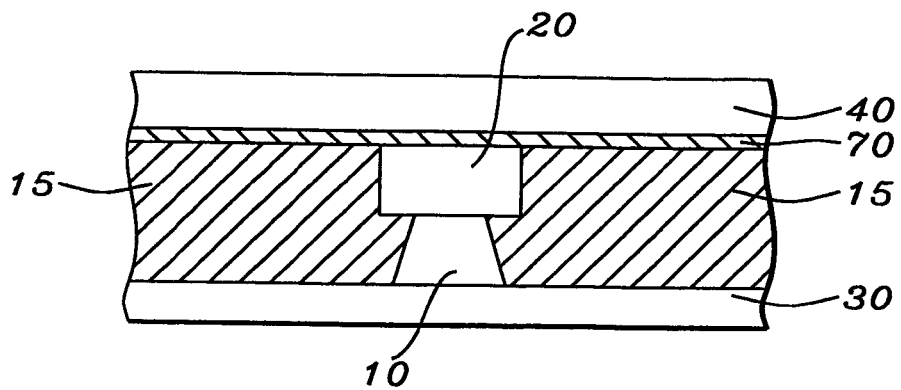
FIG. 1a – Prior Art
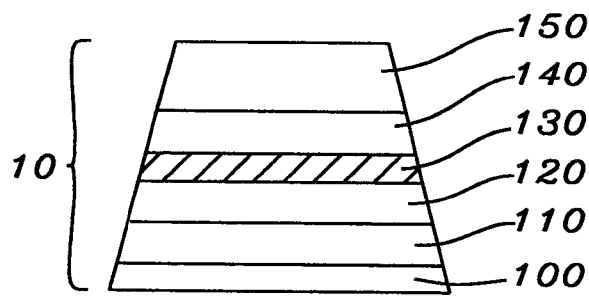
FIG. 1b – Prior Art
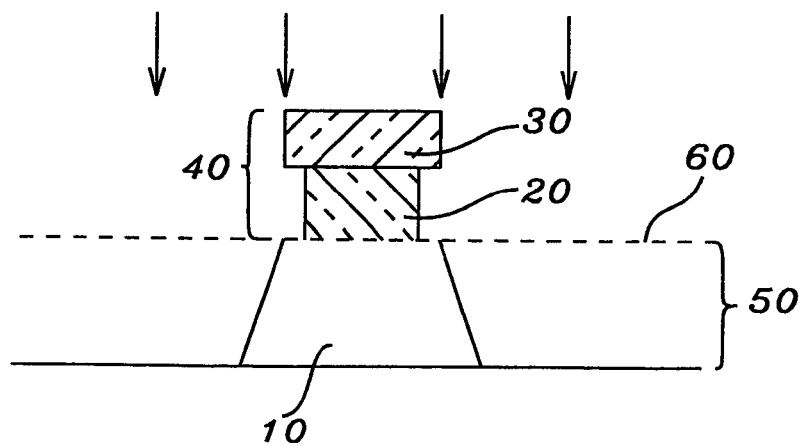
FIG. 2a – Prior Art

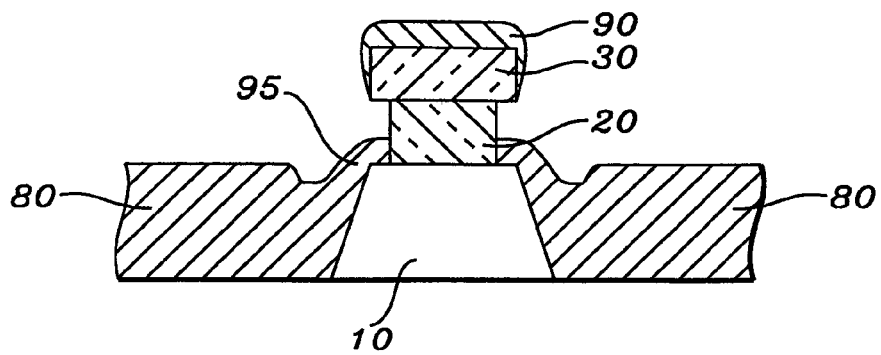
FIG. 2b – Prior Art
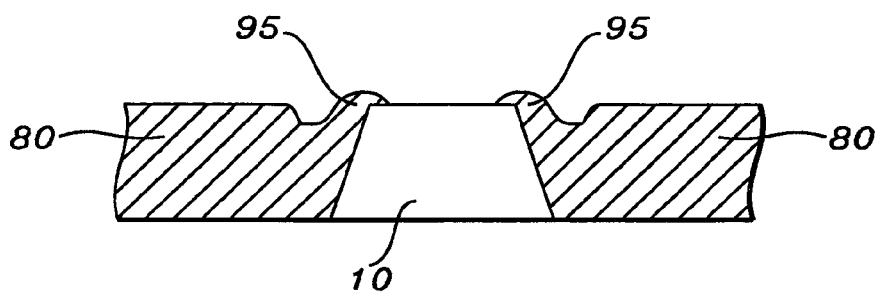
FIG. 2c – Prior Art
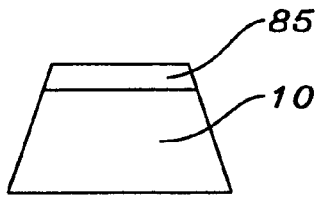
FIG. 3a – Prior Art
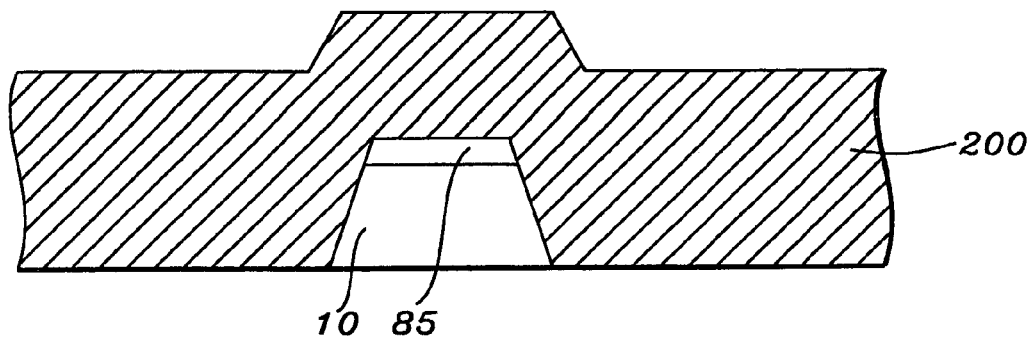
FIG. 3b – Prior Art

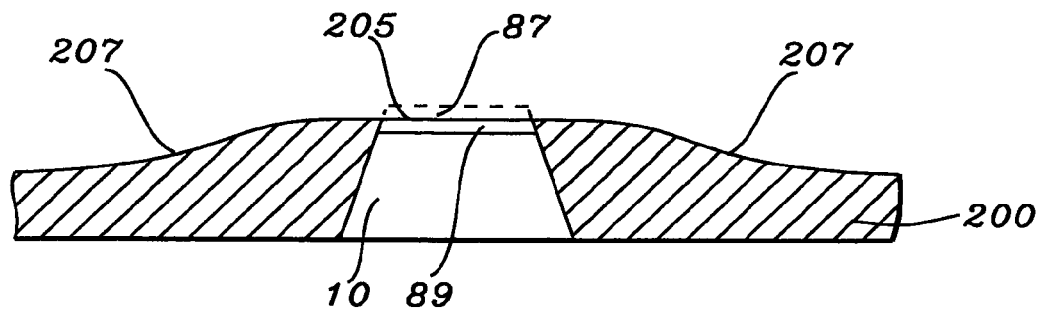
FIG. 3c – Prior Art
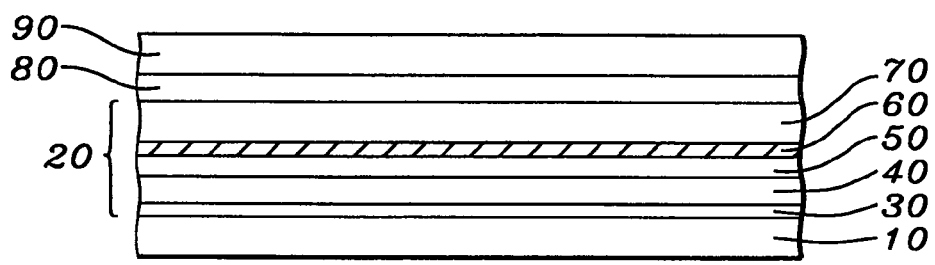
FIG. 4a
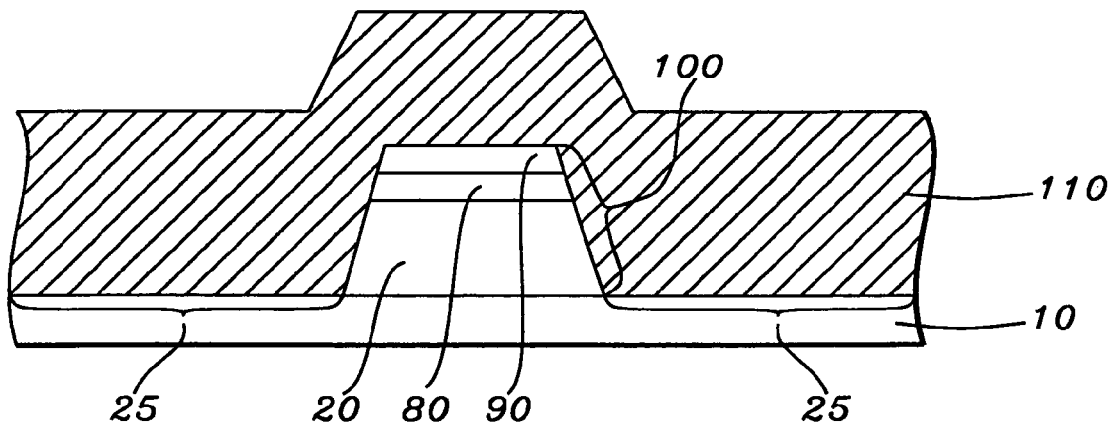
FIG. 4b

MRAM CELL WITH FLAT TOPOGRAPHY AND CONTROLLED BIT LINE TO FREE LAYER DISTANCE AND METHOD OF MANUFACTURE

This is a division of patent application Ser. No. 10/732,013, filing date Dec. 10, 2003, now U.S. Pat. No. 6,969,895, MRAM Cell With Flat Topography And Controlled Bit Line To Free Layer Distance And Method Of Manufacture, assigned to the same assignee as the present invention, which is herein incorporated by reference in its entirety.

BACKGROUND OF THE INVENTION

1. Field of the Invention

This invention relates generally to the fabrication of MRAM device structures and particularly to a structure having a flat topography and a controlled distance between the free layer of the magnetic junction and the bit line, the word line or both.

2. Description of the Related Art

A magnetic random access memory (MRAM) cell generally consists of a magnetic junction portion that is formed between at least two current carrying lines and surrounded by an insulating layer. The magnetic junction portion of the cell is capable of storing information as a result of it having different resistance states. The different resistance states can be set by a write operation and identified by a read operation by means of multiple current carrying lines (in a simple configuration, a bit line and a word line) that contact the junction at opposite ends. More specifically, if the magnetic junction portion of the cell is a magnetic tunneling junction, it consists basically of two magnetic layers separated by a thin insulating layer. The insulating layer is sufficiently thin that a current through it can be established by quantum mechanical tunneling by conduction electrons. The tunneling probability and, therefore, the resistance of the junction, can be controlled by the relative directions of the magnetizations of the two magnetic layers, one of which is typically fixed in direction (pinned layer) and the other of which is free to be changed in direction by the magnetic field of the current (the free layer).

FIG. 1a is a schematic illustration of a prior art MRAM cell in a possible configuration. The active magnetic MTJ junction region (10), which will be shown in greater detail in FIG. 1b, is formed between a top electrode (20) and a bottom electrode (30) and is surrounded by insulation (15). The top electrode (20) also functions as a bit line. A word line (40), running orthogonally to the bit line, is separated from the top electrode by a layer of insulation (70). The bottom of the junction contacts the bottom electrode (30). The word and bit lines operating together with the bottom electrode, perform read and write operations on the junction. It is also to be noted that in some designs it is the word line that is directly on top of the device.

FIG. 1b is a more detailed, though still highly schematic, illustration of the MTJ junction (10). From the bottom to the top, the junction includes a seed layer (100), an antiferromagnetic pinning layer (110), a ferromagnetic pinned layer (120) (or layers), a dielectric tunneling barrier layer (130), a ferromagnetic free layer (140) (or layers) and a capping layer (150), which can be a multi-layered stack.

The storage element (junction) and electrical lines are usually deposited as sheet films and are patterned by a photolithographic bi-layer lift-off process. This is a four step process consisting (A) of the formation of a bi-layer mask on the sheet to be patterned, (B) the use of the mask as a stencil to etch away unneeded portions of the sheet with an ion-beam etch (IBE) and to leave behind a portion having the shape of the stencil, (C) the use of the mask as a deposition mask to refill the removed portion of the sheet with a dielectric material and (D) the stripping away of the mask and any residue upon it. This process exposes the upper surface of the junction for contacting the electrical lines, leaves insulating material surrounding the junction and produces a substantially planarized upper surface for the entire fabrication. The process, which is known in the art, can be illustrated in the following figures.

(A) and (B): Referring to prior art FIG. 2a, there is shown schematically a bi-layer mask (40), which consists of an upper stencil portion (30) on a lower, undercut, pedestal portion (20). The mask is shown formed on a magnetic junction film stack (50) (which is a laminated layer containing all of the layers forming the junction as in FIG. 1b). An IBE (arrows) etches away portions of the layer (60) (shown in broken line outline) which are not directly beneath the mask, leaving the desired junction form (10).

(C): Referring to FIG. 2b, there is shown the bi-layer mask ((30)&(20)) being used as a deposition mask to allow the refilling of the etched away portion of the junction layer ((60) in FIG. 2a) with a dielectric layer (80). A dielectric residue is shown covering the mask (90). The shape of the dielectric layer (95) near the edge of the junction departs from planarity and there is a difficulty in controlling the undercut of the mask pedestal (20). If the undercut is insufficient, dielectric material will build up against the mask sides, as is shown here, and prevent a satisfactory lifting off of the mask. If the undercut is too great, the mask will become unstable or lift off before the IBE process. Therefore, there is a limit on the degree to which the process can be extended to smaller devices.

(D): Referring to FIG. 2c there is shown the fabrication of FIG. 2b wherein the bi-layer mask has been removed, together with the dielectric residue upon it. The fluctuations from planarity in the resultant topography (95) are highly disadvantageous for the formation of future device structures upon that topography. The variations in the topography become more extreme and uncontrollable as further lift-off processes are used.

One approach to relieving the topographical variations is to planarize the surfaces by a method such as chemical-mechanical polishing (CMP). This process, which is conventional in the art, is described by reference to FIGS. 3a-3c.

Referring first to prior art FIG. 3a, there is shown schematically a capped (85) magnetic junction (10), which may be formed by IBE or reactive ion etch (RIE) applied, through an appropriate mask, to a MTJ film stack layer as in FIG. 2a (the stack layer also being capped). The etch removes portions of the film stack exterior to the desired junction shape. The mask has been removed (stripped away). Note that a plurality of junction shapes may be simultaneously formed by the mask/etch process, but only one junction form is shown.

Referring next to prior art FIG. 3b, there is shown the capped junction (10), now covered by a layer of insulation (200), which covers both the junction and the surrounding region from which the original layer has been etched away.

Referring next to prior art FIG. 3c, there is shown the fabrication of FIG. 3b subsequent to a CMP which smoothes and renders substantially planar the upper surface (207) of the dielectric layer and upper surface (205) of the capped junction. The capping layer serves to prevent the CMP from damaging the active portions of the device. During the CMP process, the capping layer is reduced in thickness (89) in an uncontrollable way (the removed portion (87) shown in broken lines) and if there are many capped junctions being planarized, as in the formation of an MRAM array, the thicknesses of their capping layers can differ significantly. The inability to control the thickness of the capping layer during CMP translates into an inability to control the distance between a word line (and/or a bit line) formed on the capping layer and the free layer within the junction (s). Since the strength of the switching field at the free layer produced by current in the word (or bit) line is dependent on the distance between the word (or bit) line and the free layer, these uncontrollable distances produce a non-uniformity in the behavior of the MRAM devices.

The disadvantageous effects of non-uniformly formed device surfaces is particularly severe when such devices are to be directly integrated into associated microelectronic circuitry. Durlam et al. (U.S. Pat. No. 6,174,737 B1) disclose an MRAM device with associated CMOS circuitry and they note (column 1, line 62) the necessity of forming flat surfaces to "prevent the characteristics of an MRAM device from degrading." Durlam et al. teach the use of CMP processes (column 2, line 32) to produce a flat surface. They also teach the enclosure of word and bit lines in permalloy covers to enhance their magnetic field production.

Pan et al. (U.S. Pat. No. 6,548,849 B1) teach a method for forming an MRAM device surrounded by a magnetic yoke whose purpose is to reduce the current required to change states in the junction. Although this method addresses issues relating to power consumption in MRAM structures, it does not address the basic formation problems of smooth upper device surfaces and controllable distances between current carrying lines and the free layer of the device.

SUMMARY OF THE INVENTION

A first object of this invention is to provide a method for forming MRAM cell structures that avoids the uncontrollable variations in surface topography that result from conventional lift-off processes used in patterning the cell.

A second object of this invention is to provide a method for forming MRAM cell structures that avoids the uncontrollable variations in surface topography that result from conventional CMP processes used in planarizing the cell and surrounding insulation layers.

A third object of this invention is to provide a method for forming MRAM cell structures that allows controllability of the distance between the current carrying word line and the free layer of the cell element, the bit line and the free layer of the cell element or both the word and bit lines and the free layer of the cell element.

A fourth object of the present invention is to provide a method of forming MRAM cells that are too small to be formed by conventional processes.

A fifth object of the present invention is to provide an MRAM cell structure or a plurality of such structures, in which the distance from the bit line to the free layer, the word line to the free layer or both word and bit lines to the free layer is well controlled and the surface topography of the cell is flat.

In accord with the objects of this invention there is provided a cell junction layer structure in which a capping layer and a sacrificial layer are sequentially formed over the magnetically active tunnel junction layers. The layers are deposited as a film on a substrate and are patterned using any of a number of methods known in the art, such as RIE or plasma etch in conjunction with photolithographic masking processes. Subsequent to the patterning, the patterned structure and its surroundings are covered by a deposited layer of insulation. A CMP process then planarizes the patterned structure and the surrounding insulating layer, the CMP thereby removing all insulation from the upper surface of the patterned structure as well as a portion of the sacrificial layer, but not extending to the depth of the capping layer. The remaining sacrificial layer is then removed with precision by an etch process such as RIE or plasma etching. The choice of materials for the capping layer, the sacrificial layer and the insulating layer is determined by a requirement for selectivity of the CMP process, so that it stops within the sacrificial layer, as well as an etch selectivity so that the etch removes the remaining sacrificial layer without removing the capping layer. A preferred combination of materials is $Al_2O_3$ as the insulating layer, Ru or Cu as the capping layer and Ta, W, $SiO_2$ or $Si_3N_4$ as the sacrificial layer. Other combinations include $SiO_2$ as the insulating layer, Al, Cu, SiC or $Si_3N_4$ as the sacrificial layer and Ru or Ta as the capping layer. As a result of this process, the vertical distance (separation) between the bit line and the free layer is the thickness of the capping layer, which is well controlled within the deposition process to within +/−1%. This is an order of magnitude improvement over prior art processes in which CMP adversely affects the final thickness of the upper junction layer. It is to be noted that in the preferred embodiment of the invention the capping layer directly contacts the free layer, but even if there were intervening layers, their thickness is also precisely and well controlled by the deposition processes, so the objects of the invention would still be achieved. Although a small step may remain in the surface topography due to etching away the sacrificial layer slightly beneath the surface of the insulating layer, this may be smoothed during the next processing step which is the formation of the bit line to contact the surface of the element. In any event, the size of the step is negligible compared to surface topographical irregularities within the prior art. When a word line is finally formed over the bit line, its separation from the magnetic free layer is equally well controlled by the controlled thickness of the capping layer, the bit line and the insulation layer between the bit and word lines, all of which results from the control provided by the deposition process.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein:

FIGS. 1a-1b are schematic illustrations of a prior art MRAM cell structure (1a) and a more detailed illustration of the junction portion (1b).

FIGS. 2a-2c are schematic illustrations of prior art process steps required to form the cell structure of FIGS. 1a-1b.

FIGS. 3a-3c are schematic illustrations of problems encountered using methods of the prior art to form the cell structure of FIGS. 1a-1b.

FIGS. 4a-4f are schematic illustrations of the use of the method of the present invention in forming the cell structure of FIGS. 1a-1b and an array of such structures.

DESCRIPTION OF THE PREFERRED EMBODIMENT

Figure 4C:
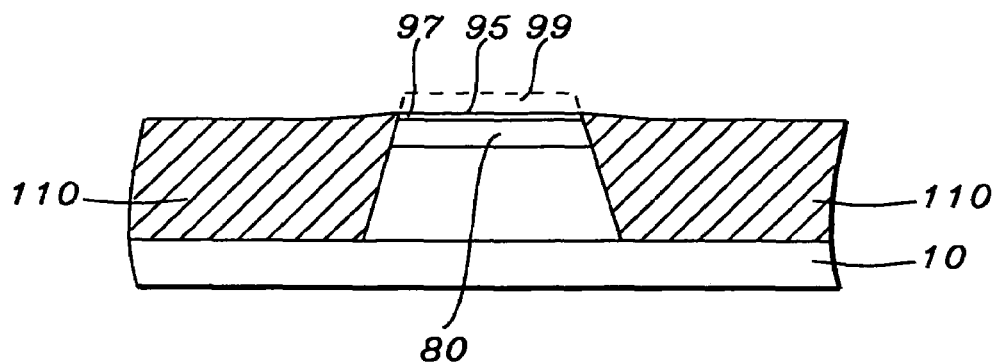

The preferred embodiment of the present invention is a method of forming an MRAM cell (or an array of such cells)

having a magnetic tunnel junction (MTJ) cell element, so that the cell topography is flat and the distance between the word line and the free layer within the element, the distance between the bit line and the free layer within the cell element or the distances between both the word and bit lines and the free layer within the cell element is well controlled. There is also provided the MRAM cell so formed.

Referring first to FIG. 4a, there is shown a substrate (10) upon which has been formed an MTJ film stack (20) (the "stack" being the laminated film structure which will subsequently be patterned to form one or a plurality of cell elements) augmented by the addition of capping (80) and sacrificial (90) layers in accord with the present method. The film stack comprises the following lamination of layers, going from bottom to top: a seed layer (30) which may be a layer of NiFeCr formed to a thickness between approximately 20 and 80 angstroms, a pinning layer formed of antiferromagnetic material such as MnPt or IrMn (40) to a thickness between approximately 30 and 300 angstroms (40), a pinned layer (50), which may be a single layer of ferromagnetic material such as CoFe, formed to a thickness between approximately 15 and 60 angstroms or which may be a synthetic antiferromagnetic layer comprising a first ferromagnetic layer of CoFe, a spacer layer of Ru or Rh and a second ferromagnetic layer of CoFe, a barrier layer (60), which is an insulating layer of $Al_2O_3$ formed to a thickness between approximately 7 and 15 angstroms, a free layer (70), which may be a layer of ferromagnetic material such as NiFe formed to a thickness between approximately 20 and 60 angstroms or which may be a bi-layer of CoFe and NiFe formed to a thickness between approximately 20 and 80 angstroms. Upon this basic junction structure film stack there is then formed a capping layer (80), which may be a layer of Cu, Ru or Ta, formed to a thickness between approximately 20 and 250 angstroms. Upon the capping layer is formed a sacrificial layer (90), which may be a layer of Ta, W, Al, Cu, $SiO_2$, SiC or $Si_3N_4$, formed to a thickness between approximately 200 and 2000 angstroms. The materials and thicknesses of the capping (80) and sacrifical (90) layers are determined so that subsequent CMP and etching process steps can be carried out with the necessary selectivity to meet the objectives of the invention. Other material combinations, also satisfying the requirements of the etching and CMP processes include $SiO_2$ as the insulating layer, Al, Cu, SiC or $Si_3N_4$ as the sacrificial layer and Ru or Ta as the capping layer.

Referring next to FIG. 4b, there is shown, in a schematic cross-sectional view, the patterned junction (100), including the patterned capping (80) and sacrificial layers (90), which has been formed by the application of photolithograpic and etching processes (which are conventional in the art) to remove portions of the film stack of FIG. 4a. These processes, which can include ion-beam etching (IBE) or reactive ion etching (RIE), guided by a photolithographic mask or stencil, are not shown in detail. A first layer of insulation (110) has been formed over the patterned junction and substrate, to fill the region from which portions of the MTJ film stack (25) has been removed during the patterning process. As noted above, the insulation can be a layer of $Al_2O_3$ or $SiO_2$, formed to a thickness between approximately 400 and 2000 angstroms. The choice of insulation materials is made so that there is CMP selectivity in subsequently removing the insulation from the upper surface of the patterned capped junction (10) without removing all of the sacrificial layer (90).

Referring next to FIG. 4c, there is shown, schematically, the fabrication of FIG. 4b wherein the insulating layer (110) has been planarized by CMP and removed, thereby, from the upper surface of the junction to expose an upper surface (95) of a remaining portion (97) of the sacrificial layer (the removed portion (99) being shown in broken lines).

Figure 4D:
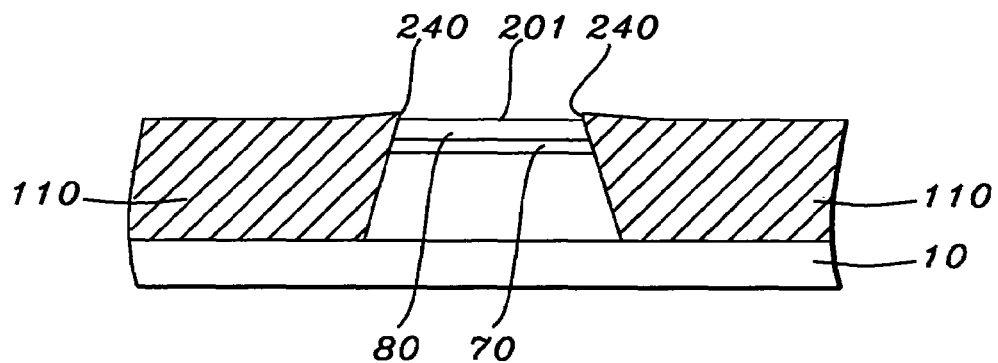

Referring next to FIG. 4d, there is shown, schematically, the fabrication of FIG. 4c wherein the remainder of the sacrificial layer ((97) in FIG. 4c) has been removed by an etch process such as a reactive-ion etch (RIE) or a plasma etch. The removal of the remaining sacrificial layer by these methods is a carefully controlled process and leaves the upper surface of the exposed capping layer (80) substantially flat (planar) with only the thickness of the capping layer (80) separating the upper surface (201) of the junction from the free layer (70) within the junction. The thickness of the capping layer can be controlled by deposition methods of the prior art to within +/−1%. Removal of the remaining layer may generally leave very small stepped protrusions (240) where the surrounding insulation extends vertically above the upper surface of the capping layer (80). These protrusions are minor and much smaller than irregularities resulting from the prior art process and, in any event, can be smoothed out by CMP during the subsequent processes that form the next layer of device structure (e.g., the bit or word line, depending on the particular device).

Figure 4E:
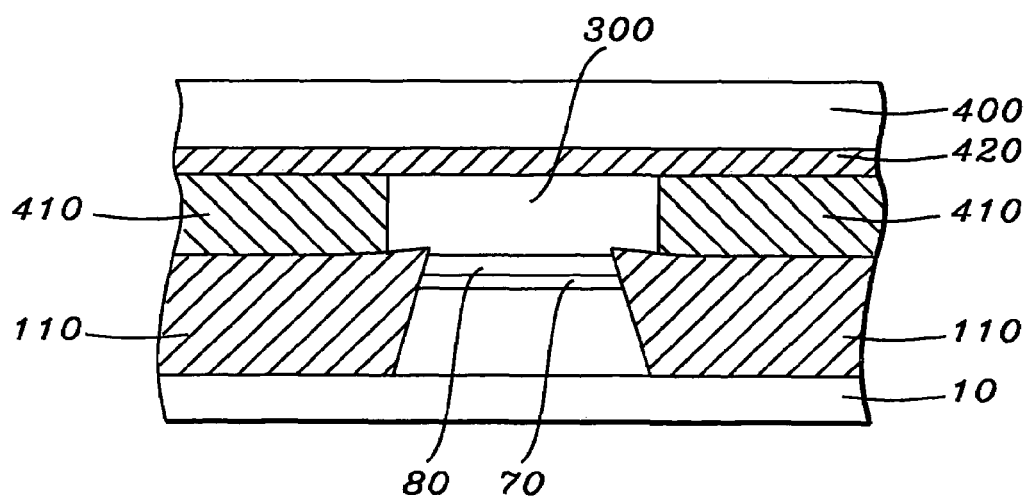
Figure 4F:
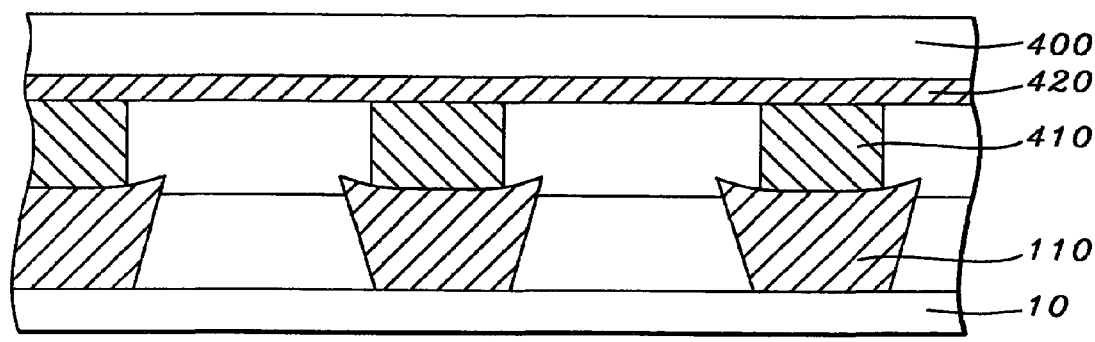

Referring next to FIG. 4e, there is shown, schematically, a bit line (300) and word line (400) formed over the completed junction of FIG. 4d. The bit line is typically surrounded by a second, laterally disposed insulating layer (410) whose upper surface is rendered substantially coplanar with the upper surface of the bit line. A third, vertically disposed insulating layer (420) insulates the bit line from the word line and is formed, by standard deposition processes to a well controlled thickness. In this form, the junction has been converted to a completed MRAM cell. It is noted once more that the particular disposition of word and bit lines may be changed in different designs. The processes involved in the deposition of the bit line, the word line and the surrounding insulation allow well controlled thicknesses to be formed, are well known in the art and are not set forth in detail herein. It is noted that the vertical separation between the word line (400) and the free layer (70) is precisely the sum of the thicknesses of the insulation layer (420), the capping layer (80) and the bit line (300), all thicknesses being extremely well controlled by the deposition process. Similarly, the distance between the bit line (300) and free layer is the well controlled thickness of the capping layer (80). It is precisely because of the novel process of removal of the sacrificial layer, which leaves the capping layer with a thickness variation of only +/−1%, together with the equally well controlled deposition of the additional layers, that the object of the invention to provide a well controlled distance between the bit line and free layer, the word line and free layer or both the word and bit lines and the free layer has been achieved. It is further noted that the flat topography and controlled distances noted herein make the present invention particularly well suited to the fabrication of MRAM cell arrays, wherein an overall planarity of topography is highly advantageous. The use of the present invention for forming a plurality of MRAM cell structures arranged in an array formation is well within the skills of the art and, as shown schematically in FIG. 4f, the flat topography is particularly advantageous for aligning bit and word lines over a plurality of arrayed MRAM cell structures formed in accord with the present method.

As is understood by a person skilled in the art, the preferred embodiments of the present invention are illustrative of the present invention rather than limiting of the present invention. Revisions and modifications may be made to materials, structures and dimensions used in forming an MRAM cell, or an array of such cells, with flat topography in which the separation between the bit line and free layer, the word line and free layer or the bit and word lines and the free layer is well controlled, while still forming an MRAM cell, or an array of such cells, with flat topography in which the separation between the bit line and free layer, the word line and free layer or the bit and word lines and the free layer is well controlled, in accord with the spirit and scope of the present invention as defined by the appended claims.

What is claimed is:

1. An MRAM cell structure in which the overall topography is flat and in which the distance between a bit line and a magnetic free layer, a word line and a magnetic free layer or a bit line and a word line and a magnetic free layer is well controlled, comprising:
   a substrate;
   a magnetic tunneling junction (MTJ) formed on the substrate, said MTJ including a magnetic free layer;
   a capping layer formed on said MTJ, the vertical separation between an upper surface of said capping layer and an upper surface of said free layer being the thickness of said capping layer and said thickness being precisely defined and well controlled;
   a first layer of insulation formed surrounding said MTJ, the upper surface of said insulation layer and the upper surface of said capping layer being rendered substantially coplanar and forming a common surface having a flat topography and the thickness of said capping layer being unchanged during said rendering as a result of a protective sacrificial layer that is completely removed;
   a bit line formed on said common surface and extending across said capping layer, wherein the vertical separation between said bit line and said magnetic free layer is well controlled to within +/−1% of said vertical separation;
   a second layer of insulation formed surrounding said bit line, an upper surface of said second layer being substantially co-planar with an upper surface of said bit line.

2. The MRAM cell structure of claim 1 further including:
   a third layer of insulation of well controlled thickness formed on said upper surface of said second layer of insulation and disposed over said bit line; and
   a word line formed over said third layer of insulation, the word line being thereby insulated from the bit line and the vertical separation between said word line and said free layer being thereby well controlled to within +/−1% of said separation.

3. The MRAM cell structure of claim 1 wherein said substrate is a bottom conducting electrode.

4. The MRAM cell structure of claim 1 wherein said MTJ junction further comprises:
   a seed layer formed on said substrate;
   an antiferromagnetic pinning layer formed on said seed layer;
   a ferromagnetic pinned layer formed on said pinning layer;
   a tunneling barrier layer formed on said pinned layer;
   a ferromagnetic free layer formed on said barrier layer.

5. The MRAM cell structure of claim 1 wherein the material of said capping layer is Ru, Cu or Ta formed to a thickness between approximately 20 and 250 angstroms.

6. The MRAM of claim 1 wherein said vertical separation between said bit line and said free layer is controlled to within +/−1% of said vertical separation by the formation of said capping layer.

7. The MRAM of claim 2 wherein said vertical separation between said word line and said free layer is controlled to within +/−1% of said vertical separation by the formation of said capping layer, said second insulation layer and said bit line.

8. An array of MRAM cells, wherein accessing bit lines and word lines are advantageously formed over a flat topography and maintain a well controlled distance to a magnetic free layer in each of said MRAM cells, comprising:
   a plurality of MRAM cells uniformly disposed in a regular two-dimensional array of uniformly spaced cells formed in parallel linear ranks, each cell including a free layer and each cell being capped by a capping layer of well controlled thickness;
   an array of parallel bit lines formed in a first direction over said MRAM cells, wherein one bit line is formed over each rank of cells; and wherein
   the overall topography of each cell is flat and the vertical separation between each bit line and a magnetic free layer within the cell vertically below said bit line is well controlled to within +/−1% of said vertical separation by the formation of said capping layer.

9. The array of claim 8 further comprising:
   layer of insulation formed over said array of parallel bit lines, said layer being of uniform and well controlled thickness; and
   a parallel array of word lines formed transversely to said first direction over said layer of insulation, said array of word lines being thereby vertically separated from said array of bit lines and crossing transversely over said bit lines and whereby each word line in said array is formed over a rank of MRAM cells and is vertically separated from said cells and whereby
   the vertical separation between each word line and the magnetic free layer in a cell directly below said word line is controlled to within +/−1% of said vertical separation by the formation of the capping layer.

* * * * *